United States Patent
Yin et al.

(10) Patent No.: US 11,650,240 B2
(45) Date of Patent: May 16, 2023

(54) SYSTEMS AND METHODS FOR IMPEDANCE-BASED BROKEN CONDUCTOR DETECTION IN ELECTRIC DISTRIBUTION SYSTEMS

(71) Applicant: GENERAL ELECTRIC TECHNOLOGY GMBH, Baden (CH)

(72) Inventors: Yujie Yin, Markham (CA); Mohammad Amin Zamani, Markham (CA); Johannes Kruger, Markham (CA); Hasan Bayat, Markham (CA)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 17/208,995

(22) Filed: Mar. 22, 2021

(65) Prior Publication Data

US 2022/0299557 A1   Sep. 22, 2022

(51) Int. Cl.
*G01R 31/08* (2020.01)
*G01R 27/16* (2006.01)

(52) U.S. Cl.
CPC .......... *G01R 31/085* (2013.01); *G01R 27/16* (2013.01)

(58) Field of Classification Search
CPC .............................. G01R 31/085; G01R 27/16
See application file for complete search history.

(56) References Cited

U.S. PATENT DOCUMENTS

| | | | |
|---|---|---|---|
| 2009/0289637 A1* | 11/2009 | Radtke | G01R 31/088 324/629 |
| 2016/0011252 A1* | 1/2016 | Kang | G01R 31/58 702/59 |
| 2019/0032407 A1 | 1/2019 | Bomidi et al. | |
| 2021/0025929 A1* | 1/2021 | Stuart | G01R 27/18 |
| 2021/0048486 A1* | 2/2021 | Bell | G01R 31/085 |

* cited by examiner

Primary Examiner — Feba Pothen
(74) Attorney, Agent, or Firm — Eversheds Sutherland (US) LLP

(57) ABSTRACT

Systems, methods, and computer-readable media are disclosed for impedance-based broken conductor detection in electric distribution systems. Upon the detection of a broken conductor, the affected overhead line will be de-energized before it hits the ground. An example method may include determining, during a first time period, a first impedance value measured by a first IED, and may further include determining, during a second time period that after the first time period, a second impedance value measured by the first IED. The method may further include determining a first ratio based on dividing a difference between the first impedance value and the second impedance value by the first impedance value, and may further include determining that the first ratio deviates from a threshold setpoint, and determining that a broken conductor condition occurs based on the first ratio deviating from the threshold setpoint.

18 Claims, 9 Drawing Sheets

SYSTEMS AND METHODS FOR IMPEDANCE-BASED BROKEN CONDUCTOR DETECTION IN ELECTRIC DISTRIBUTION SYSTEMS

FIELD OF DISCLOSURE

The present disclosure related to power distribution, and more particularly to systems and methods for impedance-based broken conductor detection.

BACKGROUND

An energized overhead power distribution line, also known as a conductor, may break and fall to the ground for a variety of reasons such as severe weather conditions, natural disasters, conductor clamp failures, tree fall, and/or fallen poles. When a falling conductor touches the earth or other grounded objects, it may cause a high-impedance (Hi-Z) fault which may not be reliably detected by conventional overcurrent protection schemes. Moreover, as the live conductor contacts the ground, it produces electrical arcing which may ignite flammable materials or vegetation and start a fire. An undetected Hi-Z fault is a risk to people and their properties as well as having a potential to evolve into a full-blown fault. Most of conventional methods may not detect all Hi-Z faults, and operation of an associated relay for downed conductor faults is not guaranteed. In addition, for such broken or falling conductors, conventional solutions may not be capable of detecting the condition and tripping the corresponding breaker(s) before the conductor touches the ground.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

OVERVIEW

Figure 1:
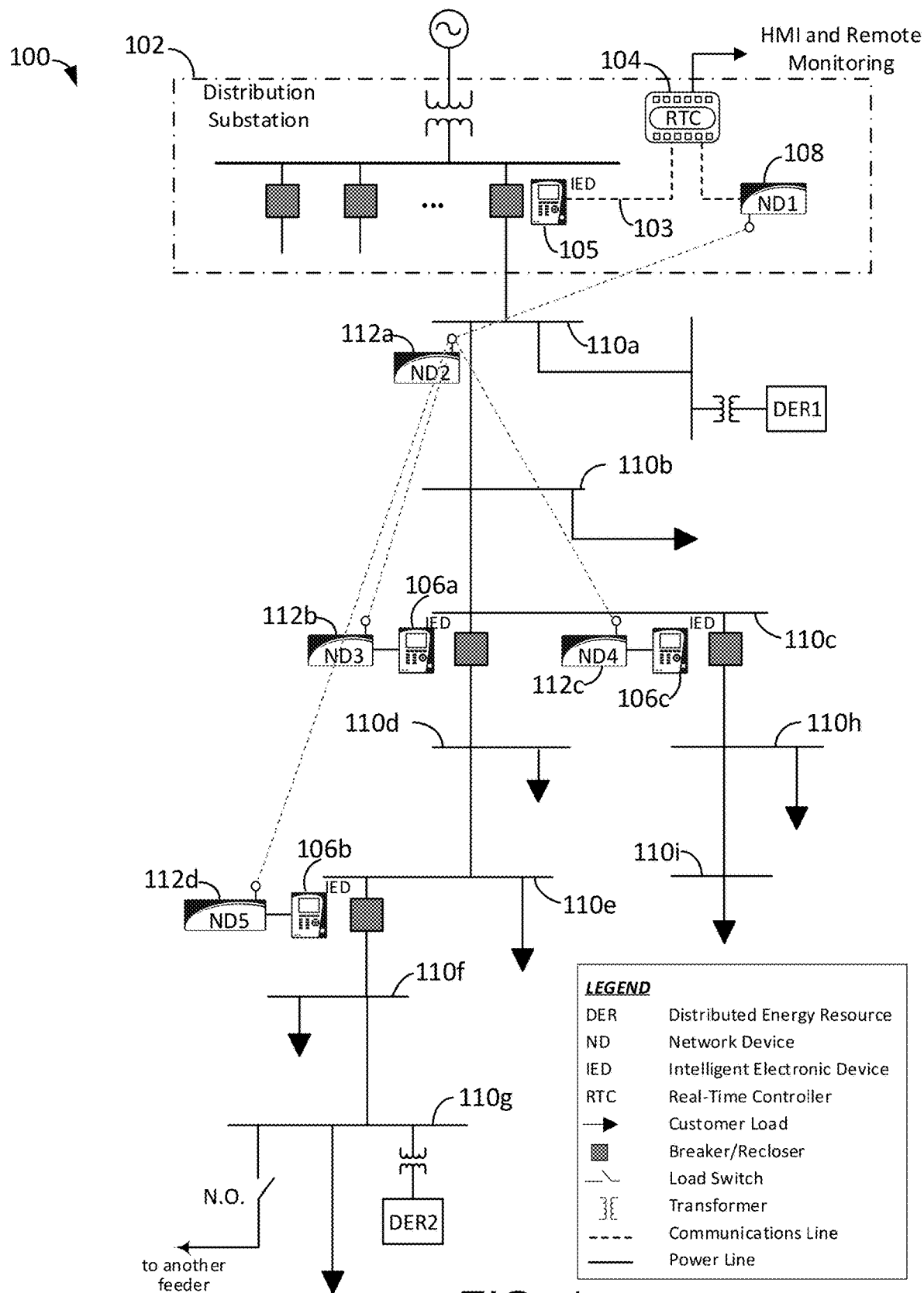
FIG. 1 is a schematic diagram of an example system and method illustrating impedance-based broken conductor detection in accordance with one or more example embodiments of the disclosure.

This disclosure relates to, among other things, systems, methods, computer-readable media, techniques, and methodologies for impedance-based broken conductor detection to effectively detect broken or falling conductors and improve the performance of overhead distribution power lines. When an overhead power line, known as a conductor, breaks, an energized conductor falls to the ground causing a high-impedance fault and arcing, which may be difficult to detect via conventional protection elements. This may potentially cause wildfires if a protection system does not operate adequately fast. Conventional systems and methods may detect broken conductors in transmission systems, but the efficiency of the conventional systems and methods may be compromised in distribution circuits with more complex topologies. Performance of broken conductor detection schemes in distribution systems may depend on several factors including but not limited to feeder topology, penetration level of distributed energy resources (DERs), broken phase location, protection philosophy, and/or type of protective devices.

In some example applications, a broken conductor condition may be detected using a current imbalance value ($|I2/I1|$) that may be a representation of the value $Z0/(Z1+Z0)$, where $Z0$ and $Z1$ denote the total zero-sequence impedance of the circuit and the total positive-sequence impedance of the circuit, respectively (including local and remote sources, loads, and the line). Considering the allowable range of current imbalance in distribution circuits, detecting a broken conductor by using only the $|I2/I1|$ value can be very challenging. Asymmetrical shunt faults within and beyond the zone of protection may also have the $|I2/I1|$ values similar to broken-conductor events. Further, during low-load conditions, the $|I2/I1|$ value may drop to relatively low values and, thus, the $|I2/I1|$ value may not exceed a setpoint value indicative of a broken conductor condition during an actual broken conductor condition. A time delay in order of seconds may not prevent the malfunction due to the possible occurrence of an asymmetrical shunt fault in its vicinity. In addition, a time coordination with upstream devices may be quite challenging for meshed systems where the power flow may be bidirectional. It may be difficult to achieve selectivity as the |I2/I1| value may be detected at all locations upstream of the actual broken point. Further, the direction of the broken point may not be ascertained with just the |I2/I1| value, thus potentially compromising protection security.

In some example applications, a broken conductor detection may rely on measuring voltage at various nodes along distribution feeders and their laterals. By calculating the rate of change of the phase voltage (dV/dt) and rate of change of the zero-sequence voltage (dV0/dt) supervised with negative-sequence voltage values, the broken conductor condition may be detected using multiple sensors at various nodes. However, the dependency on several voltage sensors at different node and necessity of a reliable high-speed communication medium to enable exchanging those data/signals with a centralized controller can limit the detection using the rate of changes for the phase voltage (dV/dt) and the zero-sequence voltage (dV0/dt).

In some embodiments, the present disclosure may provide a broken conductor detection system using synchrophasor data from one or more intelligent electronic devices (e.g., a feeder protection relay, a phasor measurement unit, and/or any suitable devices that may detect impedances) and a substation automation controller (e.g., a real-time controller or the like) with high-speed communication. For example, the broken conductor detection system may solve the broken conductor detection issue for utility distribution feeders using synchrophasor data from a single relay, i.e., the synchrophasor data provided by the substation feeder relay that was originally installed at the feeder. Additional installations may not be needed. The broken conductor detection system may provide more sensitivity in detecting the broken conductor than the |I2/I1| method described above, and more efficiency than the rate of change of voltage (dV/dt) method further described above. For instance, the broken conductor detection system may calculate a ratio of change of phase-to-ground impedances and phase-to-phase impedances to detect broken conductors along the main feeder and branches (e.g., branches having more than approximately 15% of total feeder load) of the feeder. In some embodiments, to enhance the relative effectiveness, the systems and methods may add additional relays or phasor measurement units (PMUs) at branches that carry relatively small loads. The broken conductor detection system may also utilize adaptive setpoints for the ratio of change of impedance, which may be dynamically changed based on the feeder load current. The adaptive setpoint may be inversely related to the feeder load current, i.e., when the feeder load decreases, a higher impedance change ratio may be needed to detect the broken conductor, thereby, avoiding possible malfunction due to measurement inaccuracy or single-phase load pickup under very light-load condition.

In some embodiments, the controller of the broken conductor detection system may receive synchrophasor data from the one or more intelligent electronic devices (e.g., relays and/or PMUs), and may process the data to monitor one or more changes of impedances in a distribution line. For example, the broken conductor detection system may use criteria of vertical impedance changes (i.e., change of phase impedances with time) and/or horizontal impedance changes (i.e., change of phase impedances with respect to another phase impedance) to detect one or more broken conductor conditions (e.g., a broken conductor occurred in a particular location associated with a feeder). The broken conductor detection system may be immune to existing system imbalance and transient events since the broken conductor detection system uses an impedance change ratio (ICR) over time, as described with respect to FIG. 2. Further, the broken conductor detection system may distinguish a fuse-blown condition from a broken conductor condition using the vertical impedance changes and/or horizontal impedance changes by comparing the vertical impedance changes and/or the horizontal impedance changes with one or more threshold setpoints. For example, in some embodiments, the broken conductor detection system may determine a single threshold setpoint (e.g., about 15%-18% in loss of load on each phase of an overhead line, or on a single-phase overhead line, or any suitable value set automatically and/or manually) for both the vertical impedance changes and the horizontal impedance changes. The single threshold setpoint may be indicative of an occurrence of a broken conductor condition. The broken conductor detection system may determine the occurrence of the broken conductor condition if both the vertical impedance changes and/or the horizontal impedance changes deviate from (e.g., exceeding, or greater than) the single threshold setpoint, as further described in FIG. 2. In some embodiments, the broken conductor detection system may determine an adaptive threshold setpoint for the vertical impedance changes at a particular feeder loading. The adaptive threshold setpoint may be indicative of an occurrence of a broken conductor condition corresponding to various feeder loads (e.g., feeder load current, or the like) changing with time. For example, with time increasing, the feeder load may increase or decrease with time. The broken conductor detection system may automatically adjust an adaptive threshold setpoint based on the feeder load changing with time. In some embodiments, the adaptive threshold setpoint may be inversely related to the feeder load. For example, as the feeder load reduces, the broken conductor detection system may determine a higher adaptive threshold setpoint to correctly detect a broken conductor condition, as further described in FIGS. 2 and 4.

In some embodiments, the broken conductor detection system may include a single IED (e.g., a relay, a single-phase measurement unit, a multiple-phase measurement unit, or the like) to detect a broken conductor along a feeder having a feeder main and/or one or more branches. The single IED may be located proximate to the feeder head or at the feeder head. In some embodiments, the broken conductor detection system may include two or more IEDs. For example, one of the two or more IEDs may be located proximate to the feeder head to detect a broken conductor in a feeder main close to the feeder head. Each of the remaining IEDs may be located at a particular branch of the feeder to collect data of the particular branch. The broken conductor detection system may gather data from the two or more IEDs via a communication network (wired or wireless) to determine a broken conductor condition. For example, the broken conductor detection system may compare data from each of the two or more IEDs with a single threshold setpoint and/or an adaptive threshold setpoint to determine if a broken conductor condition occurs in a particular branch. In some embodiments, with one IED at the feeder head (e.g., at substation), the broken conductor detection system may cover the feeder main and branches whose loads may be equal to or more than a certain (e.g., around 15%-20%) percent of the total feeder load. Additional IEDs may provide an additional coverage of branches that have small loads.

In some embodiments, the broken conductor detection system may include a centralized architecture in which all the IEDs may send data to a single controller (e.g., a real-time controller, a gateway, processor, or the like). The single controller may process data and determine whether or not a broken conductor condition occurs over the feeder main and/or branches. In some embodiments, the broken conductor detection system may include a distributed architecture with multiple (IEDs) and/or controllers (e.g., edge controllers). One of the multiple IEDs and/or controllers may be used to determine a broken conductor condition in a particular branch and/or feeder main in a coordinated manner. For example, the IED can monitor the voltage and current of a particular branch to detect broken conductors. Alternatively and/or additionally, the controller may receive data from one or more IEDs located in the particular branch. The IED/controller may determine a single threshold setpoint or an adaptive threshold setpoint associated with the particular branch, and may determine the vertical impedance changes and/or the horizontal impedance changes occurred in the particular branch. The IED/controller may determine a broken conductor condition if the vertical impedance changes and/or the horizontal impedance changes deviate from the single threshold setpoint or an adaptive threshold setpoint.

In some embodiments, the broken conductor detection system may detect a broken conductor condition within a time period less than a time period that a distribution conductor hits the ground. Typically, subsequent to a broken conductor condition, a distribution conductor may hit the ground in approximately several seconds (e.g., around 1.3 seconds). The broken conductor detection system may detect the broken conductor condition on the order of milliseconds (e.g., about 250 milliseconds or less). Therefore, due to the effectiveness of the broken conductor detection system, the affected circuit associated with the feeder will be de-energized prior to the conductor contacting the ground, eliminating or otherwise minimizing the risk of an arcing ground fault or energized circuits on the ground.

Typically, the detection of broken conductors in transmission and distribution systems is a challenging task as such detection depends on the system topology, distributed energy resources (DER) penetration/status, broken phase location and availability of information along the power line. In particular, traditional imbalance verifications method lack sensitivity to detect broken conductors in distribution laterals or feeder ends. Other methods to detect broken conductors may require information from several nodes of the feeder. Such requirement necessitates the need for reliable high-speed communication media within distribution systems, which may be difficult to achieve due to the high cost involved. In addition, with the high penetration of DERs, the effectiveness of voltage-based schemes may be compromised.

The present disclosure provides a technical solution, such as a broken conductor detection system for distribution overhead lines, using one or more measurements from a protective IED (e.g., an IED at the feeder head) that has been already installed to protect the power line, or measurements from IEDs that may be installed at one or more branches of the feed. The broken conductor detection system may include a controller (e.g., a real-time substation controller) and a communication network. The controller may receive and process data from the existing IED (e.g., the existing phase measurement unit installed at the substation or downstream of the feeder), and/or one or more additional IEDs (e.g., IEDs at branches of the feeder), identify a broken or falling conductor, and de-energize the affected circuit of the distribution overhead line before the conductor hits the ground or other objects. The broken conductor detection system may also automatically adjust an adaptive threshold setpoint based on a feeder load changing with time. By comparing the vertical impedance changes with real-time adaptive threshold setpoint, the broken conductor detection system may determine a broken conductor condition more accurately and efficiently. Further, the broken conductor detection system may distinguish a fuse-blown condition from a broken conductor condition by comparing the vertical impedance changes and/or the horizontal impedance changes with one or more threshold setpoints.

FIG. 1 is a schematic diagram of an example use case illustrating impedance-based broken conductor detection in accordance with one or more example embodiments of the disclosure. As shown in FIG. 1, a broken conductor detection system 100 may include a controller 104 (e.g., a real-time controller, a substation gateway, a processor, or the like), an IED 105 (e.g., relay, a phasor measurement unit, or device that measures impedances in one or more phases), and a data exchange medium 103 (e.g., Fiber, Ethernet, wireless, hardwires, or the like). The IED 105 may be located proximate to or at the feeder head 102 of a feeder (e.g., a distribution substation, or the like). For example, the IED 105 may measure data of the whole feeder having a feeder main and/or one or more branches. The controller 104 may compare data measured by the IED 105 with a single threshold setpoint, and/or an adaptive threshold setpoint to determine if a broken conductor condition occurs in the feeder main and/or branches of the feeder, as further described in FIGS. 2 and 3.

In some embodiments, the broken conductor detection system 100 may include multiple IEDs. As shown in FIG. 1, the broken conductor detection system 100 may further include IEDs 106a-b 106c, and network devices 108, 112a-112d as indicated in the dash boxes. The controller 104 may collect data from the IED 105 and IEDs 106a-b 106c via the network devices 108, and 112a-112d. In some embodiments, the IEDs 106a-106c may be one of the embodiments of the IED 105. The network devices 112a-112d may be one of the embodiments of the network device 108. The controller 104 may process the data to monitor one or more changes of impedances in overhead lines/branches 110a-110i. The IED 105 may be used to detect a broken conductor on the feeder Main (including main branches 110a and 110b) close to the feeder head 102. The IED 106a may be located proximate to or at a second branch to collect its data and cover branches with loads less than the threshold percent (e.g., overhead lines 110c-110e). Similarly, the IED 106b may be located proximate to or at a third branch (e.g., overhead lines 110f and 110g), and the IED 106c may be located proximate to or at a fourth branch (e.g., overhead lines 110h and 110i). The controller 104 may gather data from the IED 105, and the IEDs 106a-106c via the network devices 108 and 112a-112d to determine a broken conductor condition in a particular branch. The controller 104 may compare data from each of the IED 105 and the IEDs 106a-106c with a single threshold setpoint and/or an adaptive threshold setpoint to determine if a broken conductor condition occurs in a particular branch. Such additional IEDs 106a-106c may provide an additional coverage of branches that have small loads (e.g., branches having loads less than the threshold percent).

Figure 2:
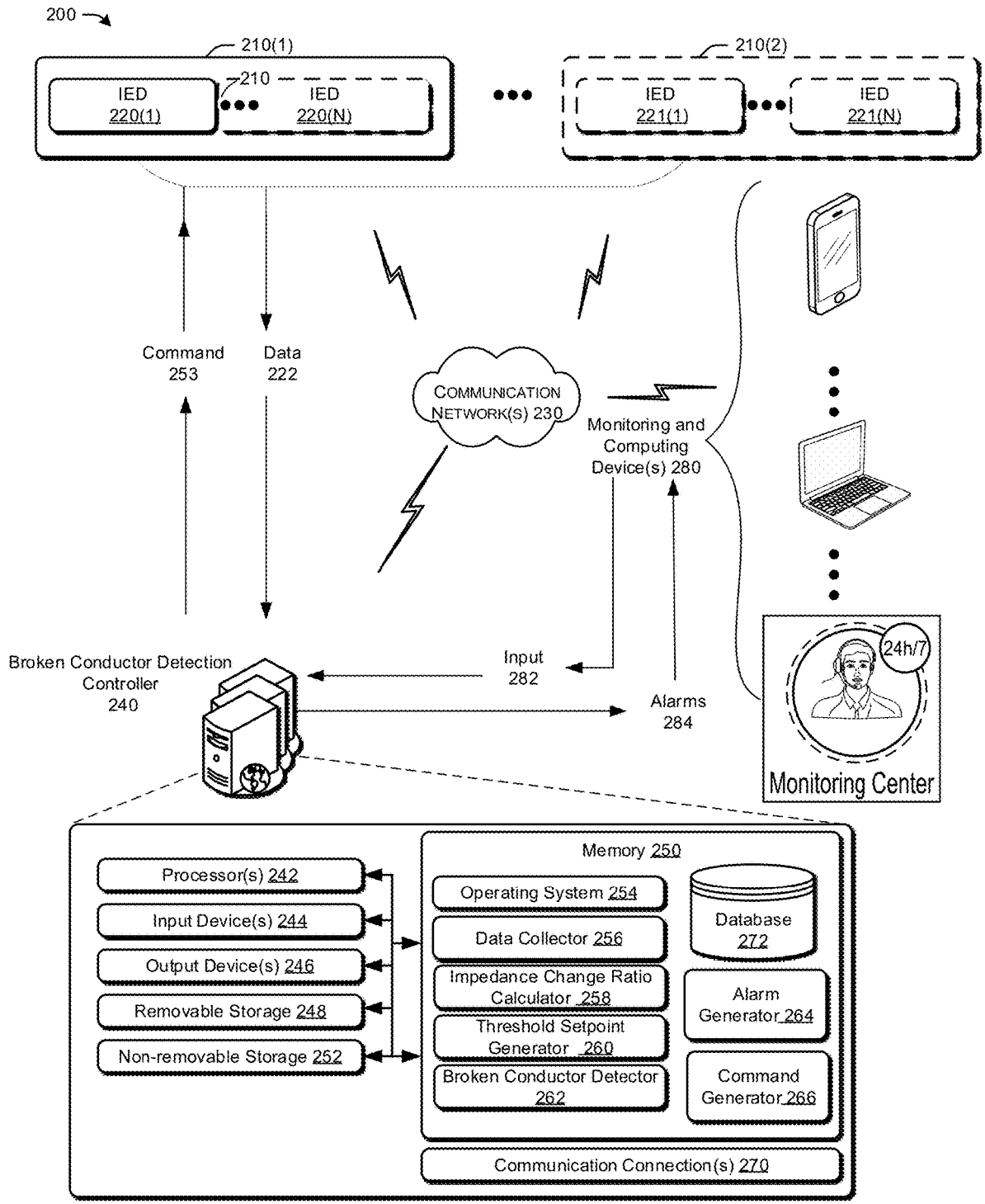
FIG. 2 is a schematic illustration of another example system and method for impedance-based broken conductor detection in accordance with one or more example embodiments of the disclosure.

FIG. 2 is a schematic illustration of an example impedance-based broken conductor detection system 200 in accordance with one or more example embodiments of the disclosure.

As shown in FIG. 2, the broken conductor detection system 200 may include one or more IEDs 220(1), . . . , 220(N) (e.g., the IEDs 105, 106a-106c of FIG. 1), a broken conductor detection controller 240 (e.g., the controller 104 of FIG. 1), and one or more monitoring and computing devices 280.

In an illustrative configuration, an IED may be a protective device configured to measure impedance values of overhead lines. In that case, a distributed architecture may be implemented without a need to an additional real-time controller, when IEDs are time-coordinated with proper margin. Alternatively, an IED may stream out one or more phasor measurements (also referred to as synchrophasor) that may estimate the magnitude and phase angle of an electrical phasor quantity (such as voltage or current) in the overhead lines using a common time source for synchronization, and may also determine the impedance values using the phasor measurements. Examples of an IED may also include a phasor measurement unit (PMU) and/or any suitable device that performs the impedance and/or phasor measurements. In some embodiments, the broken conductor detection system 200 may include a single IED 220(1) that may be located proximate to or at a feeder head of a feeder (e.g., a distribution substation, or the like), or may have been already installed at the feeder. The broken conductor detection system 200 may detect broken conductor conditions for multiple feeders. For example, the broken conductor detection system may include the single IED 220(1) for each of the feeders. In some embodiments, as shown in FIG. 2, the broken conductor detection system 200 may further include one or more IEDs per feeder, e.g., IEDs 220(2), . . . , 220(N) in addition to the IED 220(1), and 221(1), . . . , 221(N) as indicated in the dash lines. The IED 220(1) may be placed as described above. The remaining IEDs may be located at different branches along the downstream of one or more feeders. As shown in FIG. 2, a first group 210(1) of IEDs may be distributed along a first feeder, and a second group 210(2) of IEDs may be distributed along a second feeder. The IEDs 220(1), . . . , 220 (N), and 221(1), . . . , 221(N) may send synchrophasor data to the broken conductor detection controller 240 via a communication network 230.

The broken conductor detection controller 240 (also referred to as controller 240) may be configured to communicate with one or more IEDs 220 and 221, and the one or more monitoring and computing devices 280. The controller 240 may be any type of computing devices, such as, but not limited to, real-time computing devices, real-time gateway devices, computers, and/or servers. The controller 240 may include one or more servers, perhaps arranged in a cluster, as a server farm, or as individual servers not associated with one another.

The controller 240 may include at least a memory 250 and one or more processing units (or processors) 242. The processors 242 may be implemented as appropriate in hardware, software, firmware, or combinations thereof. Software or firmware implementations of the processors 242 may include computer-executable or machine-executable instructions written in any suitable programming language to perform the various functions described (e.g., in real time).

The memory 250 may store program instructions that are loadable and executable on the processors 242, as well as data generated during the execution of these programs. Depending on the configuration and type of the controller 240, the memory 250 may be volatile (such as random access memory (RAM)) and/or non-volatile (such as read-only memory (ROM), flash memory, etc.). The controller 240 or server may also include additional removable storage 248 and/or non-removable storage 252 including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 250 may include multiple different types of memory, such as static random access memory (SRAM), dynamic random access memory (DRAM), or ROM.

The memory 250, the removable storage 248, and the non-removable storage 252 may be all examples of computer-readable storage media. For example, computer-readable storage media may include volatile and non-volatile, removable and non-removable media implemented in any method or technology for the storage of information such as computer-readable instructions, data structures, program modules, or other data. The memory 250, the removable storage 248, and the non-removable storage 252 may be all examples of computer storage media. Additional types of computer storage media that may be present include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the desired information and which can be accessed by the controller 240 or other computing devices. Combinations of any of the above should also be included within the scope of computer-readable media.

Alternatively, computer-readable communication media may include computer-readable instructions, program modules, or other data transmitted within a data signal, such as a carrier wave, or other transmissions. However, as used herein, computer-readable storage media does not include computer-readable communication media.

The controller 240 may also contain communication connection(s) 270 that allows the controller 240 to communicate with a stored database, another computing/storage device or server, user terminals, the IEDs 220 and 221, the computing devices 280, and/or other devices on the communication network 230. The controller 240 may also include input device(s) 244 such as a keyboard, a mouse, a pen, a voice input device, a touch input device, etc., and output device(s) 246, such as a display, speakers, printers, etc.

Turning to the contents of the memory 250 in more detail, the memory 250 may include an operating system 254 and one or more application programs or services for implementing the features disclosed herein, including a data collector 256, an impedance change ratio calculator 258, a threshold adaptive setpoint generator 260, a broken conductor detector 262, an alarm generator 264, and a command generator 266. In some instances, the data collector 256, the impedance change ratio calculator 258, the threshold setpoint generator 260, the broken conductor detector 262, the alarm generator 264, and the command generator 266 may receive, transmit, and/or store information in the database 272.

The data collector 256 may be configured to receive data 222 from the IEDs 220 and 221. Example of data may include voltages and currents corresponding to a single phase and/or a particular phase (e.g., phase A, phase B, and/or phase C), impedance values corresponding to a single phase or a particular phase (e.g., phase A, phase B, and/or phase C), real and reactive power measurements corresponding to a single phase or a particular phase (e.g., phase A, phase B, and/or phase C), breaker status, trip signal/command, and/or any relevant data associated with the IEDs 220, and 221. The data collector 256 may store the received data 222 into the database 272.

The impedance change ratio calculator 258 may be configured to calculate vertical impedance changes (e.g., change of phase impedances with time), and/or horizontal impedance changes (e.g., change of phase impedances with respect to another phase impedance) based on the received data 222. In some embodiments, for phases A, B, and C, both phase-to-ground impedances (i.e., $Z_{Ag}$, $Z_{bg}$, $Z_{cg}$) and phase-to-phase impedances (i.e., $Z_{ab}$, $Z_{bc}$ and $Z_{ca}$) may be calculated based on voltages and currents corresponding to a particular phase. In some embodiments, for a single phase, only phase-to-ground impedances may be calculated. If the received data is lost or erroneous for the current time, the previous phasor value (e.g., the last good phasor values) may be used. The impedances are calculated per the streaming rate of an IED (e.g., approximate 60 frame/second or 120 frame/second for a PMU). The controller 240 may keep the previous valid calculated values of impedances (i.e., last immediate value before the current value): $Z'_{ag}$, $Z'_{bg}$, $Z'_{cg}$, $Z'_{ab}$, $Z'_{bc}$ and $Z'_{ca}$. A predetermined cut-off level (e.g., approximately 1% of current and voltage) may be applied for impedance calculation. If current and voltage are below the cut-off level, the current and voltage will be set to the cut-off value for impedance calculation.

The impedance change ratio ($\delta_z$) may be calculated by subtracting the previous impedance Z' (Z'=$Z_{t0-1}$) from the current impedance Z ($Z_{t0}$) and then divided by Z', as follows:

$$\delta_Z = \frac{Z - Z'}{Z'} \quad (1)$$

The vertical impedance change ratios with respect to ground are listed below as follows:

$$\delta_{Z_{ag}} = \left|\frac{Z_{ag} - Z'_{ag}}{Z'_{ag}}\right| \quad (2)$$

$$\delta_{Z_{bg}} = \left|\frac{Z_{bg} - Z'_{bg}}{Z'_{bg}}\right| \quad (3)$$

$$\delta_{Z_{cg}} = \left|\frac{Z_{cg} - Z'_{cg}}{Z'_{cg}}\right| \quad (4)$$

The vertical impedance change ratios with respect to phases are listed below as follows:

$$\delta_{Z_{ab}} = \left|\frac{Z_{ab} - Z'_{ab}}{Z'_{ab}}\right| \quad (5)$$

$$\delta_{Z_{bc}} = \left|\frac{Z_{bc} - Z'_{bc}}{Z'_{cg}}\right| \quad (6)$$

$$\delta_{Z_{ca}} = \left|\frac{Z_{ca} - Z'_{ca}}{Z'_{ca}}\right| \quad (7)$$

The horizontal impedance change ratios are listed below as follows:

$$\delta'_{Z_{ab}} = \frac{Z_{ag} - Z_{bg}}{Z_{bg}} \quad (8)$$

$$\delta'_{Z_{bc}} = \frac{Z_{bg} - Z_{cg}}{Z_{cg}} \quad (9)$$

$$\delta'_{Z_{ca}} = \frac{Z_{cg} - Z_{ag}}{Z_{ag}} \quad (10)$$

$$\delta'_{Z_{ba}} = \frac{Z_{bg} - Z_{ag}}{Z_{ag}} \quad (11)$$

$$\delta'_{cb} = \frac{Z_{cg} - Z_{bg}}{Z_{bg}} \quad (12)$$

$$\delta'_{Z_{ac}} = \frac{Z_{ag} - Z_{cg}}{Z_{cg}} \quad (13)$$

Since an IED may be sampling and sending phasor data per a sampling rate (e.g., every 1/60 second, 1/120second, or the like), continuous calculation of $\delta_Z$ represents impedance change ratio (e.g., the vertical impedance change ratios and the horizontal impedance change ratios for a monitored distribution feeder, as described above). Whenever there is an invalid phasor frame, the $\delta_Z$ will be set to zero.

In some embodiments, the impedance change ratio calculator 258 may determine a time interval between a current Z and a previous Z' based on a sampling rate of an output of an IED (e.g., synchrophasor data). The impedance change ratio calculator 258 may store previous impedance values and/or phasors received from an IED or previously calculated impedance values with a moving window (e.g., an adjustable range of previous stored impedance values and/or phasors) prior to receiving and/or calculating the current Z, as further described in FIG. 3.

Figure 3:
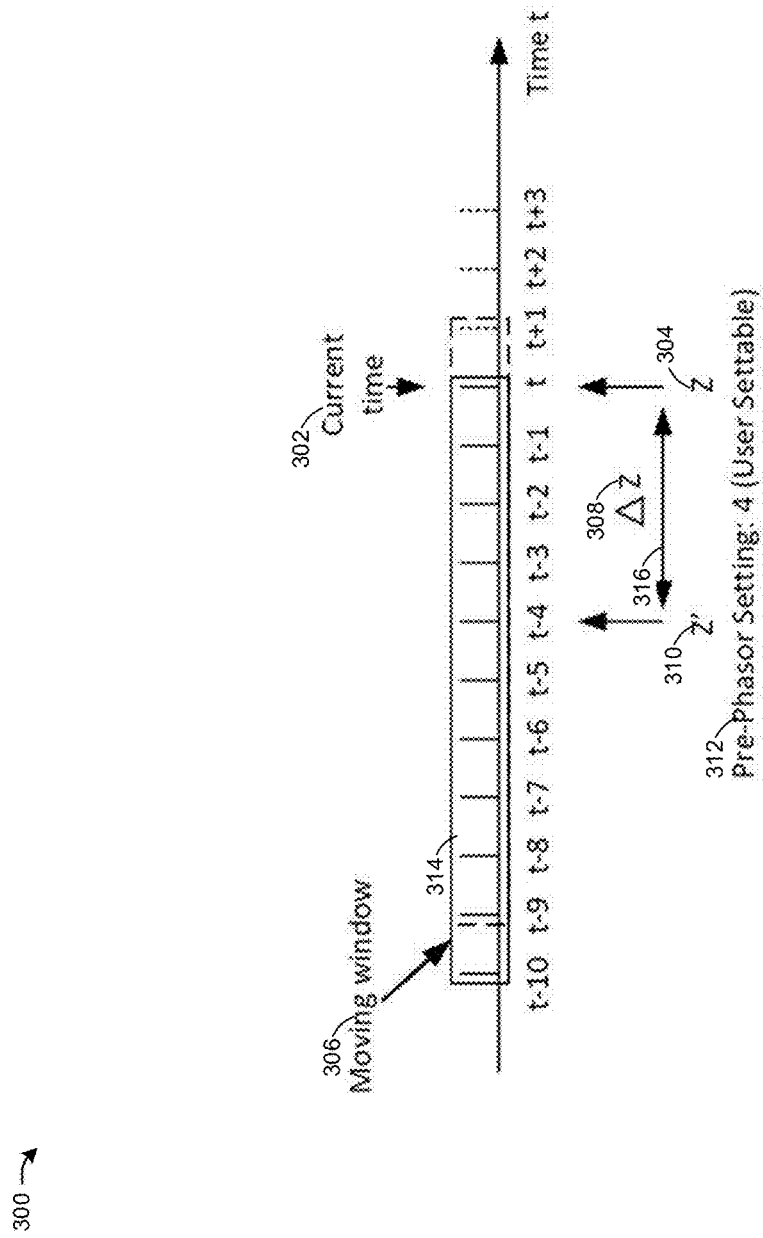
FIG. 3 is a schematic diagram of an example impedance calculation with a moving window in accordance with one or more example embodiments of the disclosure.

For example, FIG. 3 is a schematic diagram of an example impedance calculation 300 with a moving window 306 in accordance with one or more example embodiments of the disclosure. The controller 240 may store 10 previous phasors as illustrated (also referred to as pre-phasors) obtained from current time t 302 to previous time t−10 within a moving window 306. Each previous phasor corresponds to a cycle of time (e.g., a cycle 314 between t−7 and t−8). The number of stored pre-phasors may be a default value and/or predetermined by a user. A time interval may be defined by a number of cycles. As illustrated in FIG. 3, for sampling rate of 60 sample/second, 4 cycles of time (i.e., between t and t−4) may be set as a time interval 316 between the current impedance Z and the previous impedance Z' to calculate $\delta_z$ 308. As another example, for sampling rate of 120 sample/second (not shown in FIG. 3), 8 cycles of time (i.e. between t and t−8) may be set as a time interval for impedance calculation. In some embodiments, as illustrated in FIG. 3, a user may input the time interval using the monitoring and computing devices 208. In some embodiments, the impedance change ratio calculator 258 may automatically set the time interval based on a sample rate of an output of the IED (e.g., synchrophasor data). The impedance change ratio calculator 258 may obtain a previous impedance Z' by matching a time interval between Z' and Z with the determined time interval. Transient incidents may affect the calculation of the impedance. Storing one or more previous phasors may prevent the transient incidents from affecting the accuracy of the impedance calculations.

Referring back to FIG. 2, the threshold setpoint generator 260 may generate one or more threshold setpoints indicative of one or more broken conductor conditions. For example, the threshold setpoint generator 260 may receive an input 282 from the monitoring and computing devices 280 to determine a threshold setpoint. As another example, the threshold setpoint generator 260, if enabled, may automatically generate an adaptive threshold setpoint. In some embodiments, the threshold setpoint generator 260 may manually or automatically determine a single threshold setpoint (e.g., about 15%-18% in loss of load on each phase of an overhead line, or on a single-phase overhead line, or any suitable value) for both the vertical impedance change ratios and the horizontal impedance change ratios. The single threshold setpoint may be indicative of an occurrence of a broken conductor condition. In some embodiments, the threshold setpoint generator 260 may determine an adaptive threshold setpoint for the vertical impedance change ratios based on feeder loading. The adaptive threshold setpoint may be indicative of an occurrence of a broken conductor condition corresponding to various feeder loads (i.e., feeder load current, or the like) changing with time. For example, the feeder load may increase or decrease with time. The threshold setpoint generator 260 may automatically and dynamically adjust an adaptive threshold setpoint based on the feeder load changing with time. In some embodiments, the adaptive threshold setpoint may be inversely related to the feeder load. For example, as the feeder load reduces, the broken conductor detection system may determine a higher adaptive threshold setpoint to correctly detect a broken conductor condition.

Figure 4:
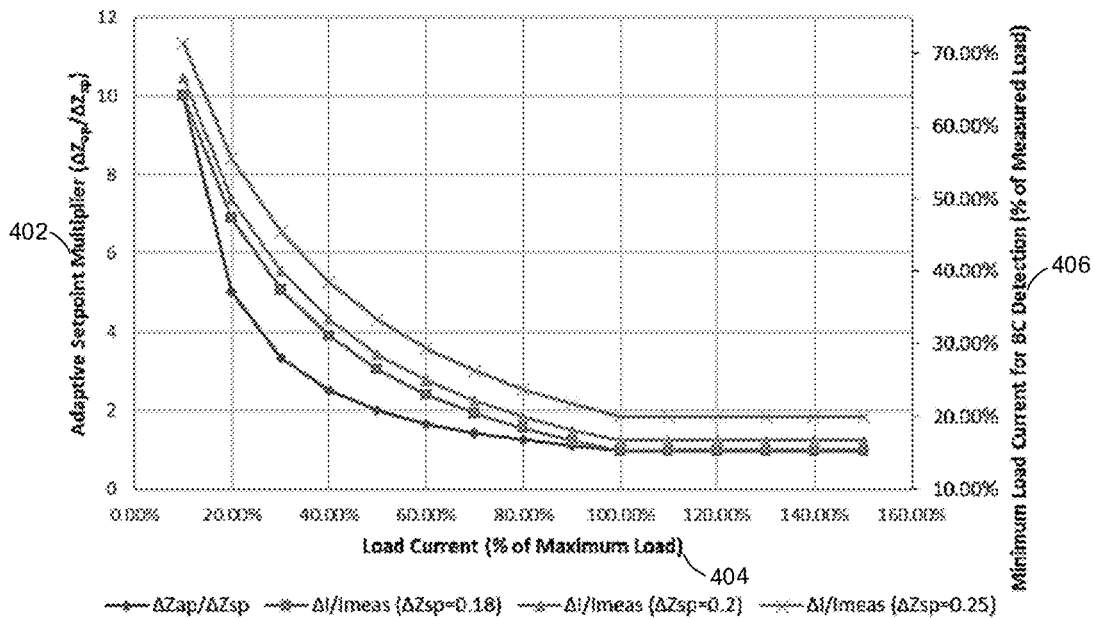
FIG. 4 is a schematic diagram illustrating an example relationship between adaptive threshold setpoints and feeder load in accordance with one or more example embodiments of the disclosure.
Figure 4:
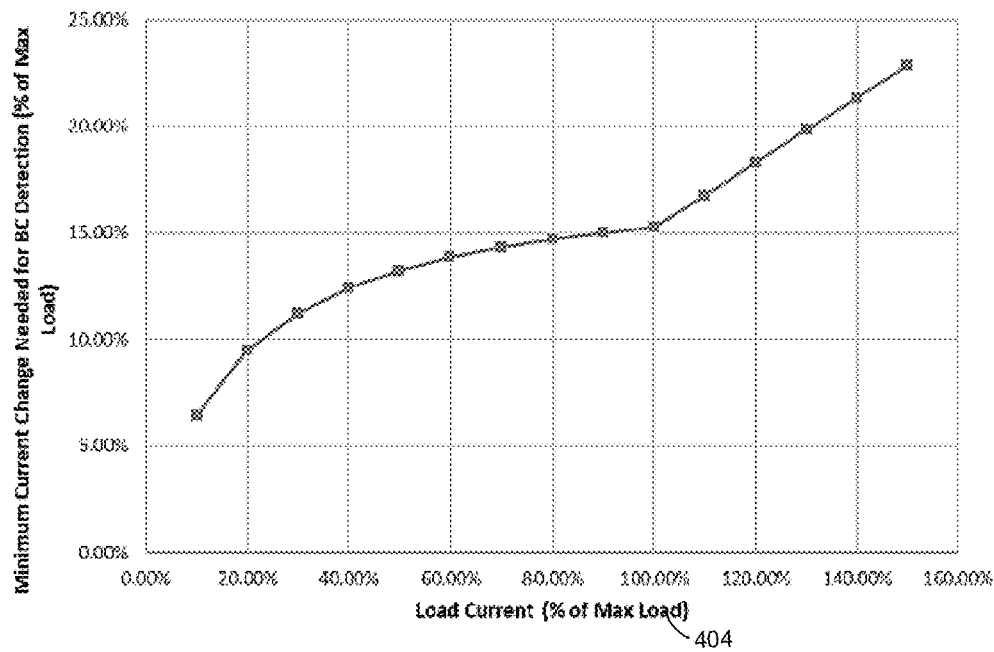

For example, FIG. 4 is a schematic diagram illustrating an example relationship between adaptive threshold setpoints and feeder load in accordance with one or more example embodiments of the disclosure. As shown in FIG. 4, a first plot 400 for adaptive setpoint multiplier (also referred to as adaptive threshold setpoints) and minimum current change required for broken conductor detection (BCD) function shows a relationship between adaptive setpoint multipliers 402 and load currents 404, and a relationship between the load currents 404 and minimum load current for BCD. As can be seen in FIG. 4, the adaptive setpoint multipliers 402 are inversely related to the feeder load currents. Thus, as the feeder load reduces, a higher impedance change ratio (ICR=$\delta_Z$) may be used to correctly detect a broken conductor condition. A second plot 410 for approximate minimum current change required for BCD function shows the minimum approximate current that a branch needs to carry such that the BCD may detect broken conductors on this branch/lateral.

Referring back to FIG. 2, the broken conductor detector 262 may determine a broken conductor condition based on a comparison between an impedance change ratio ($\delta_Z$) obtained from the impedance change ratio calculator 258 and a threshold setpoint obtained from the threshold setpoint generator 260. The broken conductor detector 262 may determine an occurrence of the broken conductor condition if the vertical impedance change ratios and/or the horizontal impedance change ratios deviate from (e.g., exceeding, or greater than) the single threshold setpoint (e.g., a default impedance change ratio value corresponding to approximately 18% of a feeder load change). In some embodiments, the broken conductor detector 262 may determine an occurrence of the broken conductor condition using a combination of an adaptive threshold setpoint and a single threshold setpoint. The broken conductor detector 262 may determine that a feeder load current is changed to a different feeder load current with time increasing. The broken conductor detector 262 may automatically adjust the adaptive threshold setpoint based on the change of the feeder load current. For example, the broken conductor detector 262 may determine an initial adaptive threshold setpoint (e.g., a default impedance change ratio value corresponding to approximately 18% of a feeder load change) manually or automatically. If the feeder load current increases/decreases with time, the broken conductor detector 262 may automatically determine an updated adaptive threshold setpoint based on the present feeder load current (e.g., a real-time feeder load current), and may decrease/increase the initial adaptive threshold setpoint to the updated adaptive threshold setpoint. The broken conductor detector 262 may compare the vertical impedance change ratios (e.g., phase to ground vertical impedance change ratios $\delta_{Z_{ag}}$, $\delta_{Z_{bg}}$, $\delta_{Z_{cg}}$) with the updated adaptive threshold setpoint, and compare the horizontal impedance change ratios with the single threshold setpoint. If the vertical impedance change ratios deviate from (e.g., exceeding, or greater than) the updated adaptive threshold setpoint, and the horizontal impedance change ratios deviate from the single threshold setpoint, the broken conductor detector 262 may determine that a broken conductor condition occurs.

In some embodiments, the broken conductor detector 262 may distinguish a non-broken-conductor condition (e.g., a fuse-blown condition caused by a single-line-to-ground (SLG) fault, or the like) from a broken conductor condition by comparing the vertical impedance change ratios and/or horizontal impedance change ratios with threshold setpoints, and impedance values obtained from different time slots. If the impedance enters the MHO characteristic (setpoints), the broken conductor detector 262 may determine that a SLG fault has occurred first.

Figure 5:
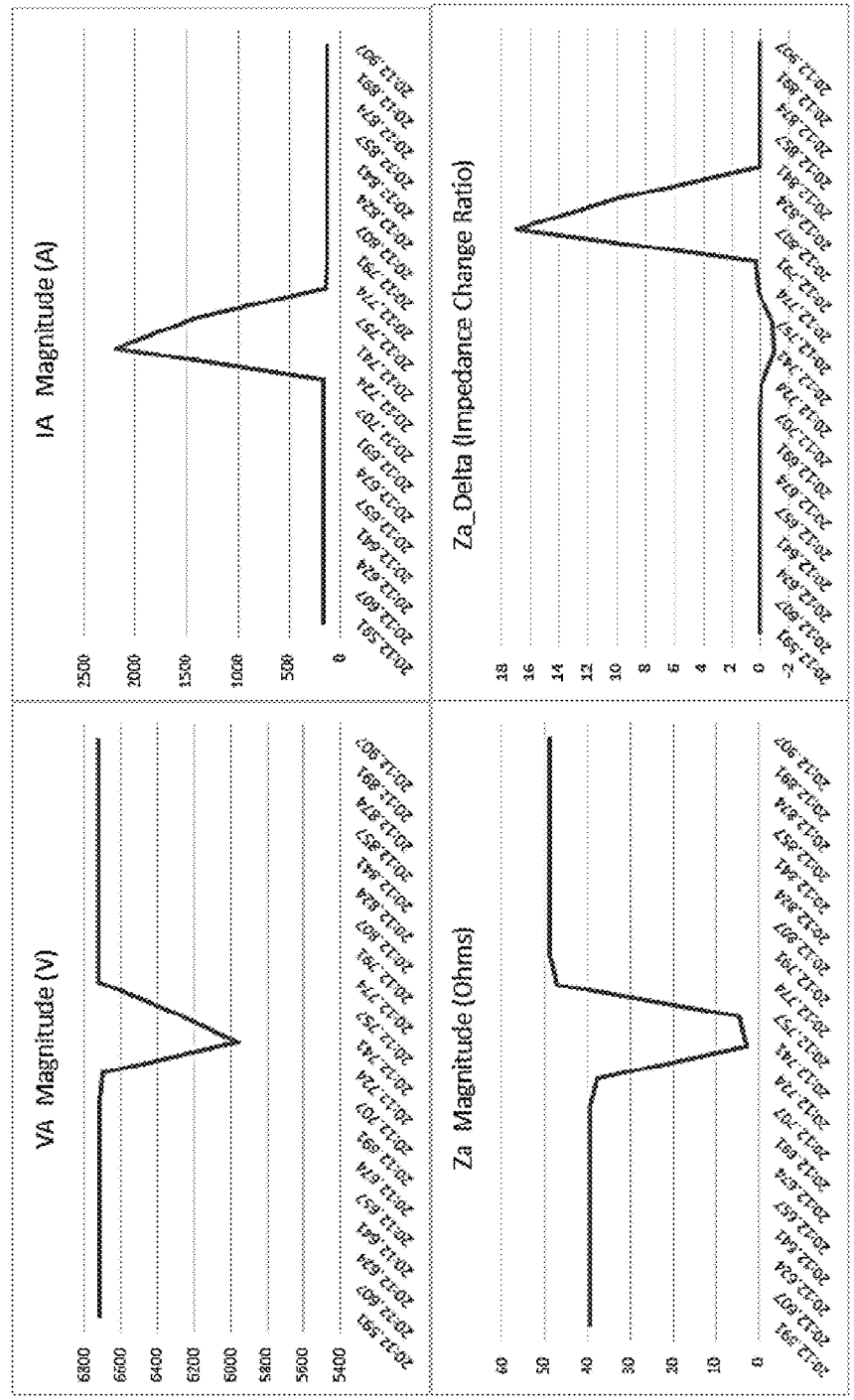
FIG. 5 is a schematic diagram illustrating system parameter variation for an example single-phase fuse blown condition in accordance with one or more example embodiments of the disclosure.

For example, FIG. 5 is a schematic diagram 500 illustrating system parameters for an example single-phase fuse blown condition in accordance with one or more example embodiments of the disclosure. As shown in FIG. 5, phase A voltage, phase A current, phase A impedance value, and impedance change ratio are measured by the controller at different time slots. The broken conductor detector 262 determines that the phase A impedance value suddenly decreases followed by an increase, while the impedance change ratio drives from a single threshold setpoint and/or an adaptive threshold setpoint. Thus, the broken conductor detector 262 may determine that a fuse blown condition occurs despite the increase in impedance change ratio. In some embodiments (not shown in FIG. 5), the broken conductor detector 262 may determine that the phase A impedance value suddenly increases, and the impedance change ratio deviates from a single threshold setpoint, and/or an adaptive threshold setpoint. The broken conductor detector 262 may determine that a phase A broken conductor occurs. Thus, based on the impedance change ratios and/or changes of impedance values with time, the broken conductor detector 262 may distinguish the broken conductor conditions from the fuse blown conditions.

In some embodiments, the broken conductor detector 262 may identify the particular phase (e.g., phase A, phase B, or phase C) that is broken based on a combination of the vertical impedance change ratios and the horizontal impedance change ratios. For example, the broken conductor detector 262 may determine a phase A broken conductor occurs, if the broken conductor detector 262 determines that $\delta_{Z_{ag}}$, $\delta'_{Z_{ab}}$, $\delta'_{Z_{ac}}$ deviates from a single threshold setpoint, and/or an adaptive threshold setpoint, (e.g., $\delta_{Z_{ag}}$ is greater than the adaptive threshold setpoint, and $\delta'_{Z_{ab}}$, $\delta'_{Z_{ac}}$ are greater than the single threshold setpoint), and determines that $\delta_{Z_{bc}}$ is less than the single threshold. Similarly, the broken conductor detector 262 may determine whether or not a phase B conductor or a phase C conductor is broken.

Referring back to FIG. 2, the alarm generator 264 may generate an alarm signal if the broken conductor detector 262 determines that a broken conductor condition occurs.

The alarm generator 264 may send the alarm signal 284 to the monitoring and computing devices 280.

The command generator 266 may generate one or more commands to control the IED 220 and/or 221, the alarm generator 264, the broken conductor detector 262, and/or other components of the broken conductor detection controller 240 to perform one or more corrective actions in response to an occurrence of a broken conductor condition. For example, the command generator 266 may generate a command to instruct the alarm generator 264 and/or the broken conductor detector 262 to operate if no fault is detected prior to a broken conductor condition (e.g., within an adjustable time "in seconds" before the operation), thereby preventing an incorrect alarm/trip when a fuse is blown, e.g., in one of the laterals. If the broken conductor detector 262 determines that a single-line-to-ground fault or a fuse blown condition occurs, the command generator 266 may generate a command to block the operation of the alarm generator 264 and/or the broken conductor detector 262. Additionally and/or alternatively, the command generator 266 may generate a trip command 253 (e.g., IEC 61850 GOOSE messages and/or I/O signals, or the like) and send the trip command 253 to the IEDs 220 and/or 221 to trip breakers of the IEDs 220 and/or 221. In some embodiments, the command generator 266 may generate a command to block the operation of the alarm generator 264 and/or the broken conductor detector 262, if a phase current is below a certain threshold (e.g., about 0.01pu) and a phase voltage is less than another threshold (e.g., about 0.8pu). The command generator 266 may provide branch candidates at which the broken conductor has happened potentially. Such branch selection may be done using static load profiles for each branch (e.g., 15 minutes daily load profiles for each branch). Branch identification may only be needed when the broken conductor detection operates. An indication message that may be displayed on the HMI with certain branches (candidates) highlighted (e.g., serval potential branches for fuse blown or broken conductor may be identified if the power flows of branches are not significantly different).

The monitoring and computing devices 280 may be any type of computing devices, such as, but not limited to, mobile, desktop, devices having human-machine interface (HMI), and/or cloud computing devices, such as servers, and work stations, or the like. The computing devices 280 may send an input 282 (e.g., selection of pre-phasor settings, a single threshold setpoint, and/or an initial adaptive threshold setpoint, instructions regarding the operations of the controller 240, or any suitable input to control the controller 240) to the controller 240 via the communication network 230. The computing devices 280 may receive an alarm signal 284 from the controller 240 via the communication network 230. In some instances, each monitoring and computing device 280 may be equipped with one or more processors and memory to store applications and data, such as an application that may display a user interface to issue the input 282 to the controller 240 and/or receive the alarm/warning signal 284.

The communication network 230 may transmit or receive data and/or instructions among the IEDs 220/221, the controller 240, and the monitoring and computing devices 280 using a transmission medium via the network interface device/transceiver utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Ethernet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver may include one or more physical jacks (e.g., Ethernet, coaxial, or phone jacks) or one or more antennas to connect to a communications network. In an example, the network interface device/transceiver may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the IEDs 220/221, the controller 240, and the monitoring and computing devices 280 and includes digital or analog communications signals or other intangible media to facilitate communication of such software. In some embodiments, the network 230 may include a cable-based network.

Figure 6:
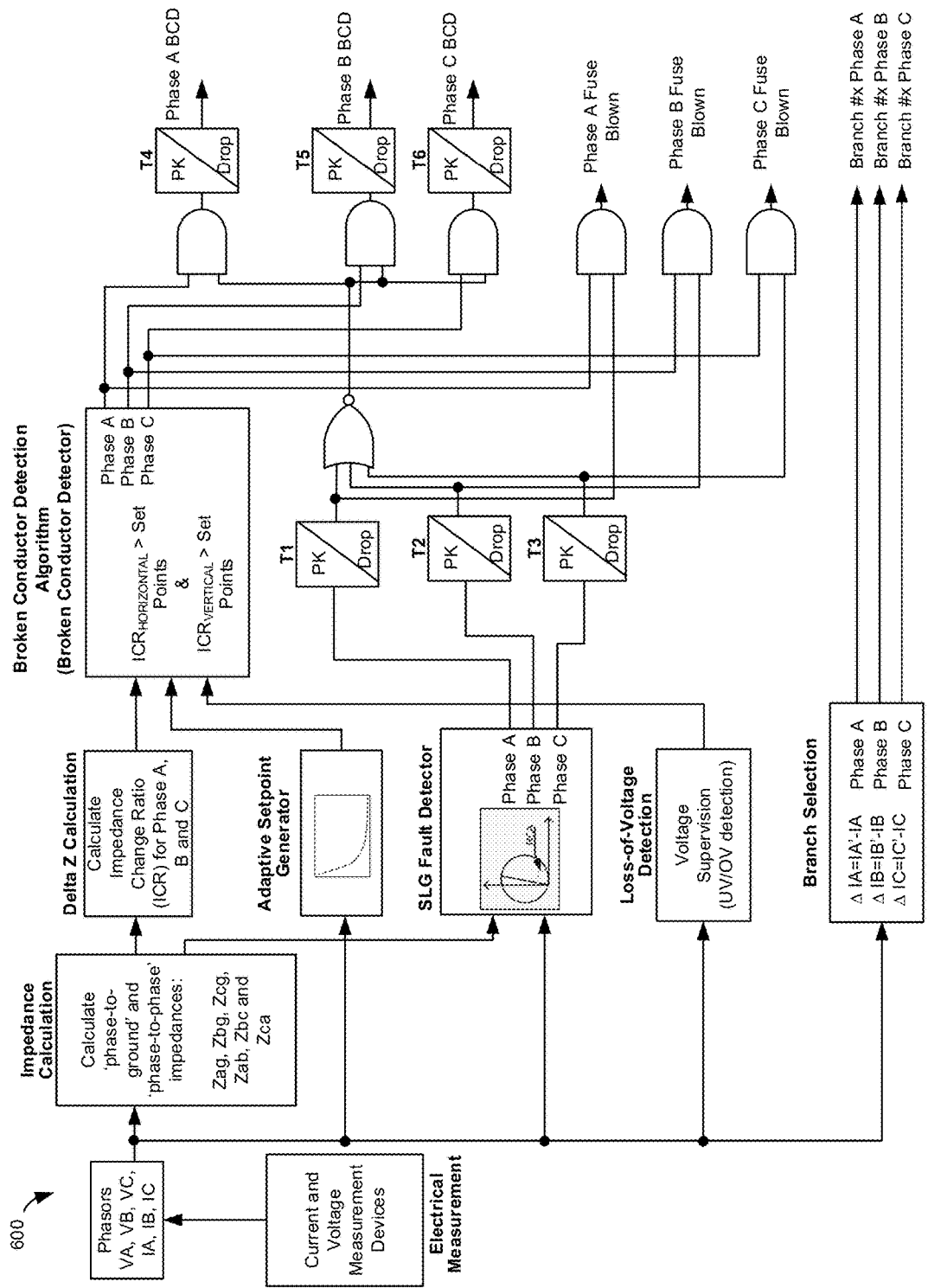
FIG. 6 is a schematic diagram illustrating an example logic diagram for broken conductor detection in accordance with one or more example embodiments of the disclosure.

FIG. 6 is a schematic diagram 600 illustrating an example logic diagram of a broken conductor detection in accordance with one or more example embodiments of the disclosure. FIG. 6 shows that the logic of a broken conductor detection for one set of synchrophasor data, i.e., one IED located proximate to or at a feeder head (e.g., IED 105 in FIG. 1, the IED 220(1) in FIG. 2). The logic may be easily implemented/extended to include other IEDs (e.g., the IEDs 106a-106c in FIG. 1, and the IEDs 220(2), ..., 220(N), and for other feeders (e.g., feeders associated with the group 210(2) in FIG. 2) controlled by the same controller (e.g., the controller 104 in FIG. 1, and the controller 240 of FIG. 2). As shown in FIG. 6, a broken conductor detection (BCD) system may receive phasors (e.g., voltages and currents) of a PMU located at a feeder head of a feeder, and may calculate vertical impedance change ratios and horizontal impedance change ratios as shown in FIG. 2. The BCD system may receive one or more setpoints, and determine adaptive threshold setpoints using the received setpoints as initial setpoints. The BCD system may determine whether or not a particular phase conductor is broken, a SLG fault occurs, an open phase occurs, and/or a particular phase fuse blown occurs using the received setpoints and the adaptive threshold setpoints. The BCD system may send a trip command (e.g., GOOSE message) to the IED based on an occurrence of the conditions mentioned above. The BCD system may also perform a branch selection indicating a branch at which the above condition occurs. For example, trip time for each IED associated with one or more broken conductors may be set and/or adjusted by a user and/or the BCD system to ensure coordination between the IEDs. In other words, the BCD system may allow the trip time for each IED associated with the broken conductors to be set such that those IEDs are coordinated. In some embodiments, multiple IEDs may work together to detect one or more broken conductor conditions. For example, the BCD system may determine a first impedance change ratio using data from a first IED associated with a feeder main of a feeder, and a second impedance change ratio using data from a second IED associated with a first branch of the feeder. If the first impedance change ratio deviates from (e.g., equal to, exceeds, or greater than) a single threshold setpoint and/or an adaptive threshold setpoint, and the second impedance change ratio is less than the single threshold setpoint and/or the adaptive threshold setpoint, the BCD system may determine that a broken conductor condition occurs in the feed main, but not the first branch. As another example, If the first impedance change ratio deviates from (e.g., equal to, exceeds, or greater than) a single threshold setpoint and/or an adaptive threshold setpoint, and the second impedance change ratio is deviates from single threshold setpoint and/or the adaptive threshold setpoint, the BCD system may determine that broken conductor conditions occur in the feed main, and the first branch. In some embodiments, multiple IEDs may coordinate with each other. For example, the BCD system may determine trip time for the second IED in coordination with the first IED. As another example, the BCD system may determine trip time for the second IED in coordination with the first IED, either in a centralize approach or a distributed approach.

Figure 7:
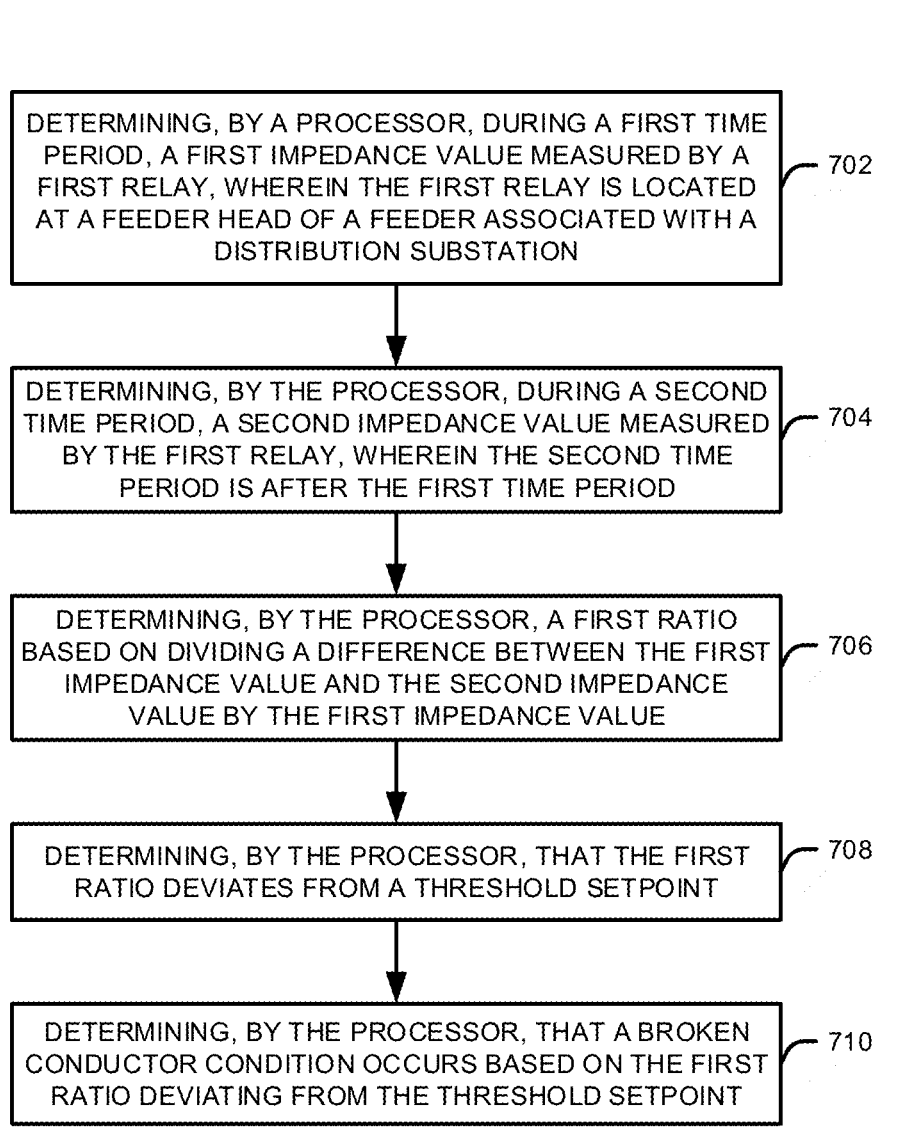
FIG. 7 is an example process flow diagram of an illustrative method for impedance-based broken conductor detection in accordance with one or more example embodiments of the disclosure.

FIG. 7 is an example process flow diagram of an illustrative method 700 for impedance-based broken conductor detection in accordance with one or more example embodiments of the disclosure. In FIG. 7, computer-executable instructions of one or more module(s) (e.g., the controller 104/240) of the broken conductor detection system 100/200 may be executed to perform broken conductor detection.

At block 702 of the method 700 in FIG. 7, the method includes determining, by a processor, during a first time period, a first impedance value measured by a first IED, wherein the first relay is located at a feeder head of a feeder associated with a distribution substation. For example, in FIG. 2, the data collector 256 may receive data from the IED 220(1), as described above.

Block 704 of the method 700 includes determining, by the processor, during a second time period, a second impedance value measured by the first IED, wherein the second time period is after the first time period. For example, in FIG. 2, the data collector 256 may receive data from the IED 220(1), as described above.

Block 706 of the method 700 includes determining, by the processor, a first ratio based on dividing a difference between the first impedance value and the second impedance value by the first impedance value. For example, in FIG. 2, the impedance change ratio calculator 258 may calculate the first ratio, as described above.

Block 708 of the method 700 includes determining, by the processor, that the first ratio deviates from a threshold setpoint. For example, in FIG. 2, the threshold generator 260 may calculate a single threshold setpoint, and/or an adaptive threshold setpoint, as described above.

Block 710 of the method 700 includes determining, by the processor, that a broken conductor condition occurs based on the first ratio deviating from the threshold setpoint. For example, in FIG. 2, the broken conductor detector 262 may determine that a broken conductor condition occurs, as described above.

The operations described and depicted in the illustrative process flow of FIG. 7 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 7 may be performed.

One or more operations of the process flow of FIG. 7 may have been described above as being performed by a user device, or more specifically, by one or more program modules, applications, or the like executing on a device. It should be appreciated, however, that any of the operations of process flow of FIG. 7 may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the process flow of FIG. 7 may be described in the context of the illustrative broken conductor detection controller, it should be appreciated that such operations may be implemented in connection with numerous other device configurations.

It should further be appreciated that the controller 104/240 may include alternate and/or additional hardware, software, or firmware components beyond those described or depicted without departing from the scope of the disclosure. More particularly, it should be appreciated that software, firmware, or hardware components depicted as forming part of the controller 104/240 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Figure 8:
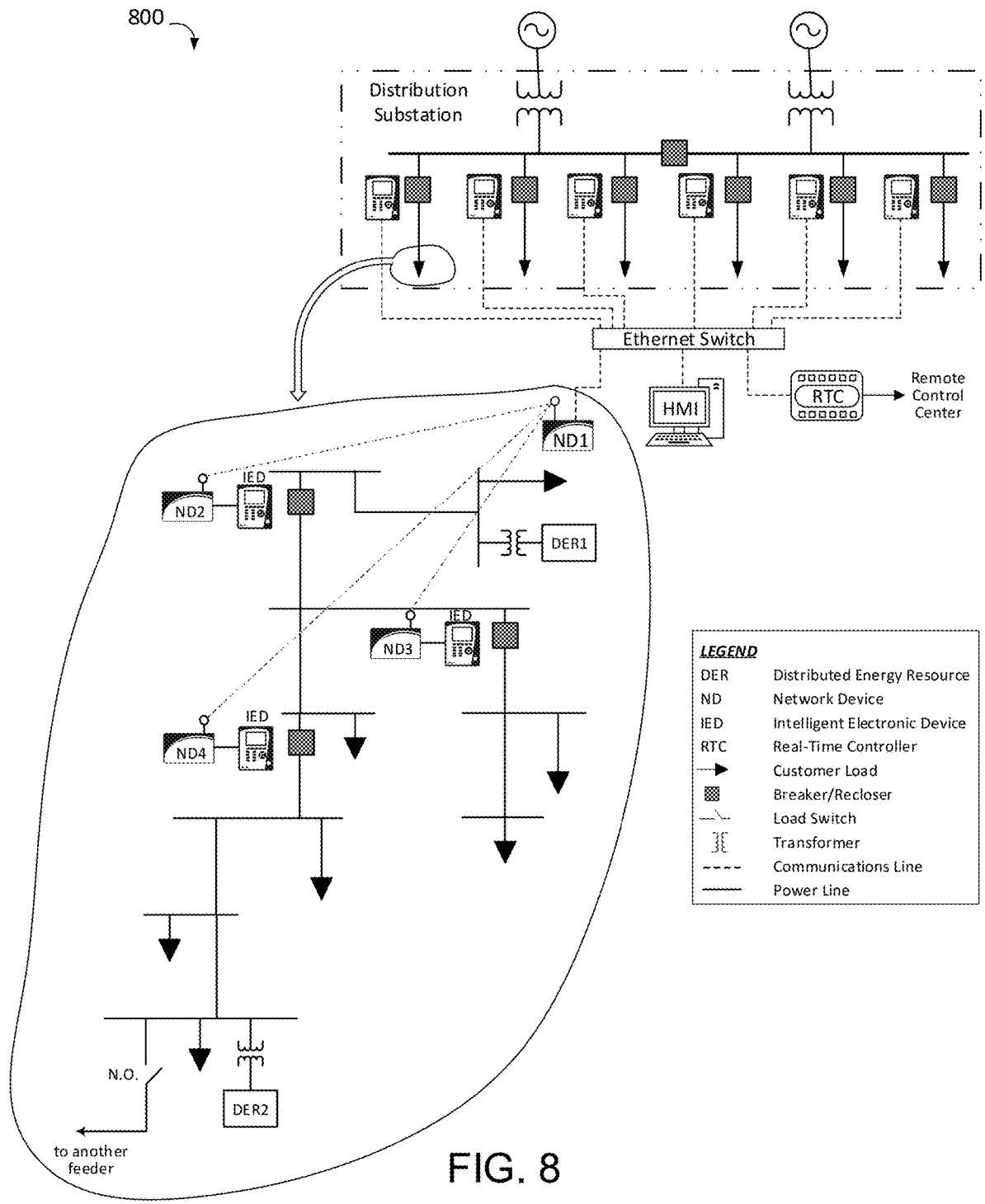
FIG. 8 is a schematic illustration of an example system and method illustrating multiple feeders controlled by a single controller for broken conductor detections in distribution systems in accordance with one or more example embodiments of the disclosure.

FIG. 8 is a schematic illustration of an example use case 800 illustrating multiple feeders controlled by a single controller for broken conductor detections in accordance with one or more example embodiments of the disclosure. As shown in FIG. 8, the controller (e.g., the controller 240 in FIG. 2) may receive data associated with multiple feeders. For each feeder, the controller may receive data from IEDs associated with that feeder (e.g., the group 210(2) of FIG. 2), calculate impedance change ratios, and determine a single threshold setpoint and/or an adaptive threshold setpoint, and determine that a broken conductor condition occurs for that feeder, as described in FIG. 2.

Figure 9:
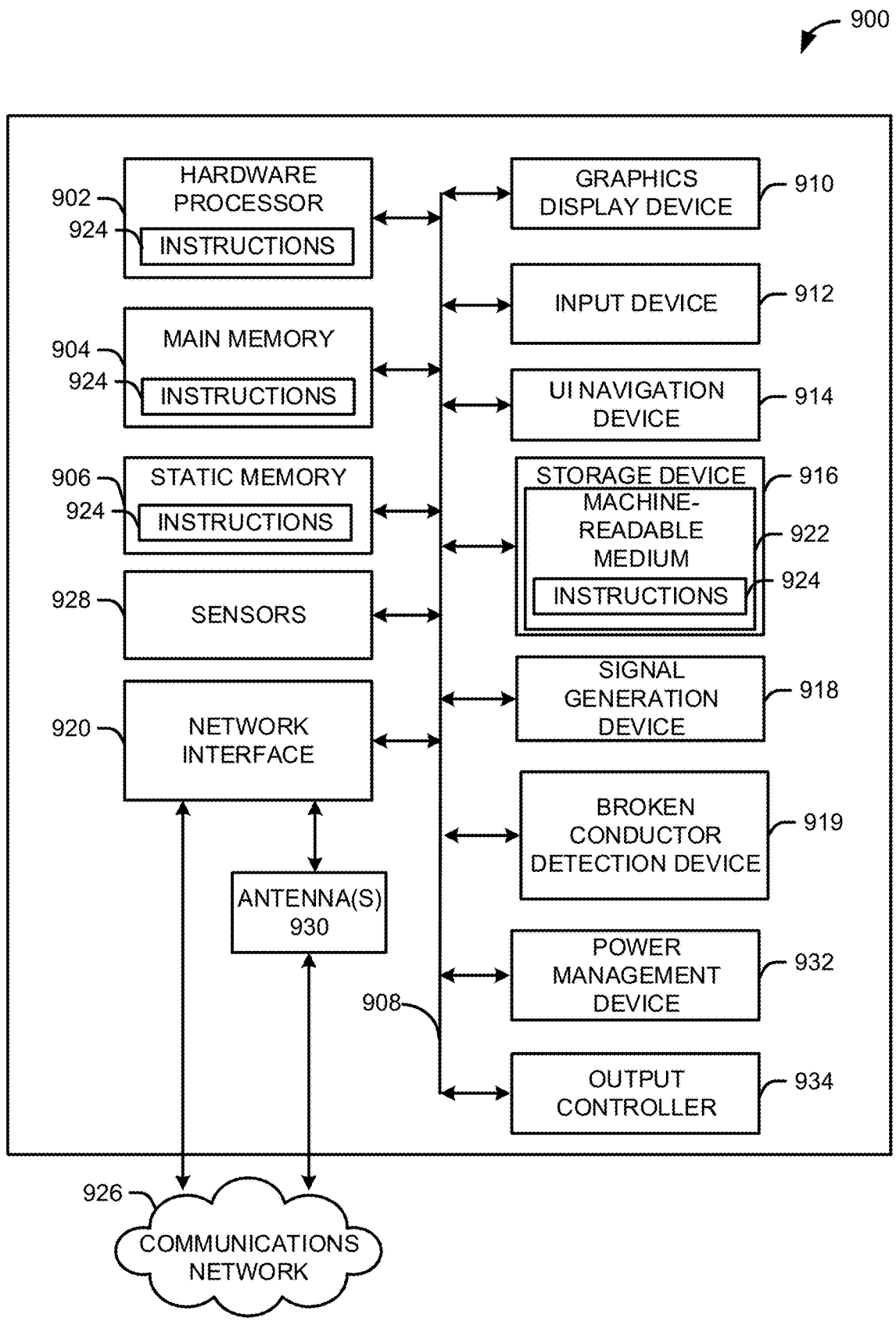
FIG. 9 is a block diagram of an example of a machine or system for broken conductor detection in accordance with one or more example embodiments of the disclosure.

FIG. 9 is a block diagram of an example of a machine or system 900 for broken conductor detections in accordance with one or more example embodiments of the disclosure.

In other embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environments. The machine 900 may be a server (e.g., a real-time server), a computer, an automation controller, a network router, a switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer-readable medium containing instructions where the instructions configure the execution units to carry out a specific operation when in operation. The configuration may occur under the direction of the execution units or a loading mechanism. Accordingly, the execution units are communicatively coupled to the computer-readable medium when the device is operating. In this example, the execution units may be a member of more than one module.

For example, under operation, the execution units may be configured by a first set of instructions to implement a first module at one point in time and reconfigured by a second set of instructions to implement a second module at a second point in time.

The machine (e.g., computer system) 900 may include a hardware processor 902 (e.g., a central processing unit (CPU), a graphics processing unit (GPU), a hardware processor core, or any combination thereof), a main memory 904 and a static memory 906, some or all of which may communicate with each other via an interlink (e.g., bus) 908. The machine 900 may further include a power management device 932, a graphics display device 910, an input device 912 (e.g., a keyboard), and a user interface (UI) navigation device 914 (e.g., a mouse). In an example, the graphics display device 910, input device 912, and UI navigation device 914 may be a touch screen display. The machine 900 may additionally include a storage device (i.e., drive unit) 916, a signal generation device 918 (e.g., an emitter, a speaker), a broken conductor detection device 919, a network interface device/transceiver 920 coupled to antenna(s) 930, and one or more sensors 928, such as a global positioning system (GPS) sensor, a compass, an accelerometer, or other sensor. The machine 900 may include an output controller 934, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 916 may include a machine readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, or within the hardware processor 902 during execution thereof by the machine 900. In an example, one or any combination of the hardware processor 902, the main memory 904, the static memory 906, or the storage device 916 may constitute machine-readable media.

The broken conductor detection device 919 may carry out or perform any of the operations and processes (e.g., the logic diagram 600 of FIG. 6, and/or the process 700 of FIG. 7) described above. The broken conductor detection device 919 may be one embodiment of the controller 104/240. For example, the broken conductor detection device 919 may include at least the data collector 256, the impedance change ratio calculator 258, the threshold setpoint generator 260, the broken conductor detector 262, the alarm generator 264, and/or the command generator 266.

While the machine-readable medium 922 is illustrated as a single medium, the term "machine-readable medium" may include a single medium or multiple media (e.g., a centralized or distributed database, and/or associated caches and servers) configured to store the one or more instructions 924.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 900 and that cause the machine 900 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device/transceiver 920 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 920 may include one or more physical jacks (e.g., Ethernet, coaxial, or phone jacks) or one or more antennas to connect to the communications network 926. In an example, the network interface device/transceiver 920 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "monitoring and computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

It is understood that the above descriptions are for purposes of illustration and are not meant to be limiting.

Although specific embodiments of the disclosure have been described, numerous other modifications and alternative embodiments are within the scope of the disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database task or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

That which is claimed is:

1. A method comprising:
   determining, by a processor, during a first time period, a first impedance value measured by a first IED, wherein the first IED is located at a feeder head of a feeder associated with a distribution substation;
   determining, by the processor, during a second time period, a second impedance value measured by the first IED, wherein the second time period is after the first time period;
   determining, by the processor, a first ratio based on dividing a difference between the first impedance value and the second impedance value by the first impedance value;
   determining, by the processor, that the first ratio deviates from a threshold setpoint, wherein the threshold setpoint is a first threshold setpoint associated with a first feeder load current of a distribution overhead line associated with the feeder;
   determining, by the processor, that a broken conductor event occurs based on the first ratio deviating from the threshold setpoint;
   determining, by the processor, that the first feeder load current is changed with time to a second feeder load current;
   determining, by the processor, a second threshold setpoint based on the second feeder load current; and
   adjusting, by the processor, the first threshold setpoint to the second threshold setpoint.

2. The method of claim 1, wherein the first impedance value and the second impedance value are with respect to a ground and are associated with a first phase of a distribution overhead line associated with the feeder, the method further comprising:

determining, by the processor, during the second time period, a third impedance value measured by the first IED, wherein the third impedance value is associated with a second phase of the distribution overhead line with respect to the ground;

determining, by the processor, a second ratio based on dividing a difference between the second impedance value and the third impedance value by the third impedance value; and determining, by the processor, that the second ratio derives from the threshold setpoint, wherein determining that the broken conductor event occurs is further based on the second ratio deviating from the threshold setpoint.

3. The method of claim 1, further comprising:

determining, by the processor, during the first time period, a fourth impedance value measured by the first IED, wherein the fourth impedance value is associated with a second phase relative to a third phase of a distribution overhead line associated with the feeder;

determining, by the processor, during the second time period, a fifth impedance value measured by the first IED, wherein the fifth impedance value is associated with the second phase relative to the third phase;

determining, by the processor, a third ratio based on dividing a difference between the fourth impedance value and the fifth impedance value by the fourth impedance value;

determining, by the processor, that the third ratio is less than the threshold setpoint; and determining, by the processor, that the broken conductor event relative to a first phase occurs based on the third ratio being less than threshold setpoint.

4. The method of claim 1, wherein the second feeder load current is greater than the first feeder load current, and wherein the second threshold setpoint is less than the first threshold setpoint.

5. The method of claim 1, further comprising:

determining, by the processor, during a third time period, a third impedance value measured by the first IED, wherein the third time period is prior to the first time period when the first impedance value is calculated; and determining, by the processor, that a fuse blown condition occurs based on determining that the third impedance value is greater than the first impedance value, and the second impedance value is greater than the first impedance value, wherein determining that the fuse blown condition occurs is further based on the first ratio deviating from the threshold setpoint, wherein determining that the broken conductor event occurs based on determining that the third impedance value is less than the first impedance value and the second impedance value.

6. A method comprising:

determining, by a processor, during a first time period, a first impedance value measured by a first IED, wherein the first IED is located at a feeder head of a feeder associated with a distribution substation;

determining, by the processor, during a second time period, a second impedance value measured by the first IED, wherein the second time period is after the first time period;

determining, by the processor, a first ratio based on dividing a difference between the first impedance value and the second impedance value by the first impedance value;

determining, by the processor, that the first ratio deviates from a threshold setpoint;

determining, by the processor, that a broken conductor event occurs based on the first ratio deviating from the threshold setpoint;

storing, by the processor, two or more impedance values prior to receiving the second impedance value, wherein the two or more impedance values comprise the first impedance value;

determining, by the processor, a time interval between the first time period and the second time period based on a sampling rate of an output of the IED, wherein the time interval is associated with a number of cycles of time of the output of the IED; and retrieving, by the processor, the first impedance value based on the time interval.

7. The method of claim 1, wherein the broken conductor event is a first broken conductor event, wherein the first IED is associated with a feeder main of the feeder, the method further comprising:

determining, by the processor, during the first time period, a third impedance value measured by a second IED, wherein the second IED is located at a downstream location of the feeder, and the second IED is associated with a first branch of the feeder;

determining, by the processor, during the second time period, a fourth impedance value measured by the second IED;

determining, by the processor, a second ratio based on dividing a difference between the third impedance value and the fourth impedance value by the third impedance value;

determining, by the processor, that the second ratio deviates from the threshold setpoint;

determining, by the processor, that a second broken conductor event occurs in the first branch based on the second ratio deviating from the threshold setpoint; and determining trip time for the second IED associated with the second broken conductor event in coordination with the first IED associated with the first broken conductor event.

8. The method of claim 1, wherein the feeder head is a first feeder head, the feeder is a first feeder, the threshold setpoint is a first threshold setpoint, and the broken conductor condition is a first broken conductor event, the method further comprising:

determining, by the processor, during the first time period, a third impedance value measured by a second IED, wherein the second IED is located at a second feeder head of a second feeder associated with the distribution substation;

determining, by the processor, during the second time period, a fourth impedance value measured by the second IED;

determining, by the processor, a second ratio based on dividing a difference between the third impedance value and the fourth impedance value by the third impedance value;

determining, by the processor, that the second ratio deviates from a second threshold setpoint; and determining, by the processor, that a second broken conductor event occurs based on the second ratio deviating from the second threshold setpoint.

9. The method of claim 1, further comprising:

sending an alarm signal indicative of the occurrence of the broken conductor event to one or more monitoring and computing devices; and performing one or more corrective actions in response to the occurrence of the broken conductor event, wherein the one or more corrective actions comprise sending a trip signal to the first IED.

10. A system comprising:
a feeder;
a first IED configured to measure one or more impedance values, wherein the first IED is located at a feeder head of the feeder associated with a distribution substation;
a memory coupled to at least one processor; the at least one processor configured to:
determine, during a second time period, a second impedance value measured by the first IED, wherein the second time period is after the first time period;
determine a first ratio based on dividing a difference between the first impedance value and the second impedance value by the first impedance value;
determine that the first ratio deviates from a threshold setpoint, wherein the threshold setpoint is a first threshold setpoint associated with a first feeder load current of a distribution overhead line associated with the feeder;
determine that a broken conductor event occurs based on the first ratio deviating from the threshold setpoint;
determine that the first feeder load current is changed with time to a second feeder load current;
determine a second threshold setpoint based on the second feeder load current; and
adjust the first threshold setpoint to the second threshold setpoint.

11. The system of claim 10, wherein the first impedance value and the second impedance value are with respect to a ground and are associated with a first phase of a distribution overhead line associated with the feeder, wherein the at least one processor is further configured to:
determine, during the second time period, a third impedance value measured by the first IED, wherein the third impedance value is associated with a second phase of the distribution overhead line with respect to the ground;
determine a second ratio based on dividing a difference between the second impedance value and the third impedance value by the third impedance value; and
determine that the second ratio derives from the threshold setpoint,
wherein determining that the broken conductor event occurs is further based on the second ratio deviating from the threshold setpoint.

12. The system of claim 11, wherein the at least one processor is further configured to:
determine, during the first time period, a fourth impedance value measured by the first IED, wherein the fourth impedance value is associated with the second phase relative to a third phase of a distribution overhead line associated with the feeder;
determine, during the second time period, a fifth impedance value measured by the first IED, wherein the fifth impedance value is associated with the second phase relative to the third phase;
determine, a third ratio based on dividing a difference between the fourth impedance value and the fifth impedance value by the fourth impedance value;
determine that the third ratio is less than the threshold setpoint; and determine that the broken conductor event relative to the first phase occurs based on the third ratio being less than threshold setpoint.

13. The system of claim 10, wherein the second feeder load current is greater than the first feeder load current, and wherein the second threshold setpoint is less than the first threshold setpoint.

14. The system of claim 10, wherein the at least one processor is further configured to:
determine, during a third time period, a third impedance value measured by the first IED, wherein the third time period is prior to the first time period when the first impedance value is calculated; and
determine that a fuse blown condition occurs based on determining that the third impedance value is greater than the first impedance value, and the second impedance value is greater than the first impedance value, wherein determining that the fuse blown condition occurs is further based on the first ratio deviating from the threshold setpoint,
wherein determining that the broken conductor event occurs based on determining that the third impedance value is less than the first impedance value and the second impedance value.

15. The system of claim 10, wherein the at least one processor is further configured to:
store two or more impedance values prior to receiving the second impedance value, wherein the two or more impedance values comprise the first impedance value;
determine a time interval between the first time period and the second time period based on a sampling rate of an output of the IED, wherein the time interval is associated with a number of cycles of time of the output of the IED; and
retrieve the first impedance value based on the time interval.

16. The system of claim 10, wherein the broken conductor event is a first broken conductor event, wherein the first IED is associated with a feeder main of the feeder, the system further comprising:
a second IED that is located at a downstream location of the feeder, the second IED associated with a first branch of the feeder;
wherein the at least one processor is further configured to:
determine, during the first time period, a third impedance value measured by the second IED;
determine, during the second time period, a fourth impedance value measured by the second IED;
determine, a second ratio based on dividing a difference between the third impedance value and the fourth impedance value by the third impedance value;
determine that the second ratio deviates from the threshold setpoint;
determine that a second broken conductor event occurs in the first branch based on the second ratio deviating from the threshold setpoint; and
determine trip time for the second IED in coordination with the first IED.

17. The system of claim 16, wherein the first IED is associated with a feeder main of the feeder, the system further comprising:
a second IED that is located at a downstream location of the feeder, the second IED associated with a first branch of the feeder;
wherein the at least one processor is further configured to:
determine, during the first time period, a third impedance value measured by the second IED;

determine, during the second time period, a fourth impedance value measured by the second IED;

determine, a second ratio based on dividing a difference between the third impedance value and the fourth impedance value by the third impedance value;

determine that the second ratio is less than the threshold setpoint;

determine that the broken conductor event occurs in the feeder main based on the first ratio deviating from the threshold setpoint, and the second ratio being less than the threshold setpoint; and determine trip time for the first IED in coordination with the second IED.

18. The system of claim 10, wherein the feeder head is a first feeder head, the feeder is a first feeder, the threshold setpoint is a first threshold setpoint, and the broken conductor condition is a first broken conductor event, the system further comprising:

a second feeder;

a second IED that is located at a second feeder head of the second feeder associated with the distribution substation;

wherein the at least one processor is further configured to:
determine, during the first time period, a third impedance value measured by the second IED;

determine, during the second time period, a fourth impedance value measured by the second IED;

determine, a second ratio based on dividing a difference between the third impedance value and the fourth impedance value by the third impedance value;

determine that the second ratio derives from a second threshold setpoint; and determine that a second broken conductor event occurs based on the second ratio deviating from the second threshold setpoint.

* * * * *